United States Patent [19]
daCosta et al.

[11] 4,186,340
[45] Jan. 29, 1980

[54] APPARATUS FOR MEASURING THE MAGNETIC STRENGTH OF MAGNETIC WORK PIECES

[75] Inventors: Harry daCosta; Paul L. Krichbaum, both of Scottsdale, Ariz.

[73] Assignee: Motorola, Inc., Schaumburg, Ill.

[21] Appl. No.: 720,856

[22] Filed: Sep. 7, 1976

Related U.S. Application Data

[63] Continuation of Ser. No. 591,265, Jun. 30, 1975, abandoned.

[51] Int. Cl.² .................................. G01R 33/12
[52] U.S. Cl. ........................................ 324/205
[58] Field of Search ................................ 324/42

[56] References Cited

U.S. PATENT DOCUMENTS 3,803,430  4/1974  daCosta et al. .............. 310/40 MM

FOREIGN PATENT DOCUMENTS 1591934  10/1970  Fed. Rep. of Germany ............. 324/42

Primary Examiner—Robert J. Corcoran
Attorney, Agent, or Firm—Michael D. Bingham

[57] ABSTRACT

What is disclosed is an apparatus for measuring the relative magnetic field strength of magnetic workpieces such as miniature permanent magnet rotors which, for example, are included in miniature watch motors. The apparatus includes a nonmagnetic shaft member, one end of which is attached to a motor and the other end being positioned in a bearing. The shaft has a reduced portion thereof extending beyond the bearing and located between the poles of an electromagnet which acts as a miniature alternator. Located in the end of the shaft opposite the motor, are inserts for receiving the magnetic workpiece which may be a basic rotor or a rotor/axle assembly. The shaft is rotated at a speed which produces an alternating magnetic field in the electromagnetic pole pieces thus generating an alternating current voltage. This voltage is measured on a digital volt meter or the like with maximum and minimal levels established by calibrating with good and average rotors.

7 Claims, 7 Drawing Figures

U.S. Patent  Jan. 29, 1980  Sheet 2 of 2  4,186,340
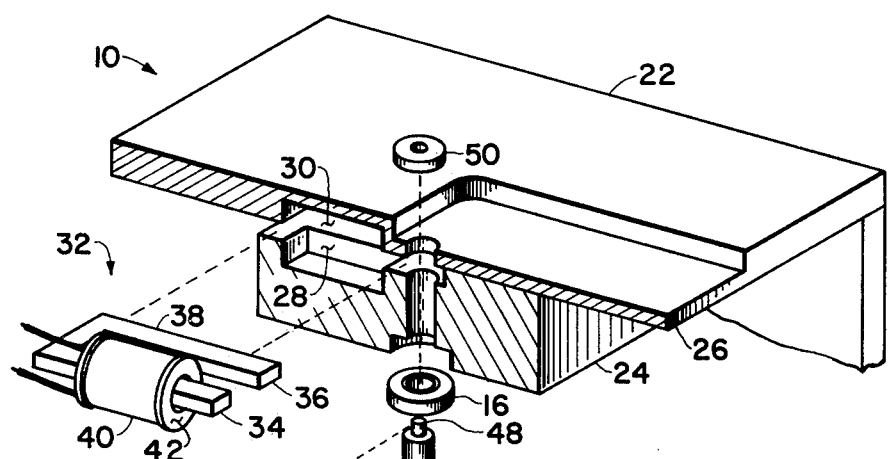
FIG. 2
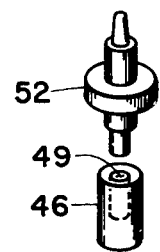
FIG. 5
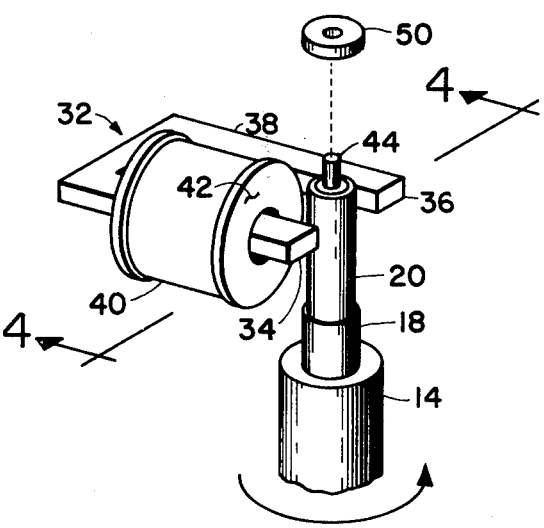
FIG. 6
FIG. 3
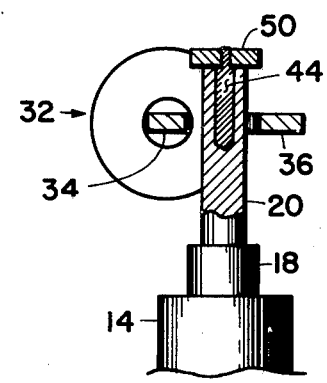
FIG. 4

APPARATUS FOR MEASURING THE MAGNETIC STRENGTH OF MAGNETIC WORK PIECES

This is a continuation, of application Ser. No. 591,265, filed June 30, 1975 now abandoned.

BACKGROUND OF THE INVENTION

This invention relates to the testing of magnetic workpieces which include a permanent magnet member to determine their respective magnetic field strength, and more particularly to the testing of precision components for a miniature watch motor or the like.

In watch motors, the permanent magnet rotor must have sufficient magnetic strength in order to maintain minimal starting torque for advancing the rotor, which in turn advances the seconds, minutes and hours indicators of the watch. With the magnetic strength of the rotor/axle assembly being optimum the efficiency of the watch motor is increased thereby prolonging battery lifetime. Therefore, it is necessary to determine the magnetic strength of the motor magnet system in order to insure that the magnetic strength thereof is in a predetermined range to insure the above condition. Also, wide variations in magnetic strength of the rotor and rotor assembly will produce similar variations in product yield, as the motor magnet system is reasonably sensitive to magnetic field strength changes.

Thus, a need exists to provide an efficient and accurate test apparatus for measuring the magnetic strength of the rotors in the most economical manner.

SUMMARY OF THE INVENTION

Accordingly, it is an object of this invention to provide an improved apparatus for measuring the relative magnetic field strength of a magnetic workpiece.

It is another object of the invention to provide a test apparatus for measuring the relative magnetic field strength of miniature permanent magnet watch motor rotors without effecting the magnetic strength thereof.

It is a further object of the invention to provide a test apparatus for measuring the relative magnetic field strength of miniature watch motor rotors and/or rotor assemblies which is suitable to test the rotor and/or rotor assembly at a high production rate.

In carrying out the invention in one form, there is provided an apparatus for measuring the relative magnetic field strength of a magnetic workpiece including; a nonmagnetic shaft, a structure for attaching the magnetic workpiece to one end of the shaft, a magnetic member having at least two poles which are interposed about the shaft and in close proximity to the magnetic workpiece, a member attached to the other end of the shaft for rotating the shaft and the magnetic workpiece such that a voltage is generated from the magnetic member in response to the rotational movement of the magnetic workpiece, the magnitude of the generated voltage being proportional to the magnetic field strength of the magnetic workpiece, and a system for measuring and displaying the magnitude of said generated voltage such that the relative magnetic field strength of the magnetic workpiece may be determined by visual means.

BRIEF DESCRIPTION OF THE DRAWINGS

FIG. 2 is an exploded perspective view somewhat fragmentary with a section cut away of the detector housing according to the invention;

FIG. 3 is an enlarged perspective view of the magnetic detecting mechanism;

FIG. 4 is an elevational view of the magnetic detecting mechanism with a cutout portion of one component of the embodiment of the invention taken substantially in the direction of arrows 4—4 of FIG. 2;

FIG. 5 is an enlarged perspective view of the insert used to attach the rotor/axle assembly to the detector mechanism;

FIG. 6 is an enlarged perspective view of the insert used to attach the permanent magnet disk (rotor) to the detector mechanism.

DETAILED DESCRIPTION OF THE PREFERRED EMBODIMENT

Figure 1:
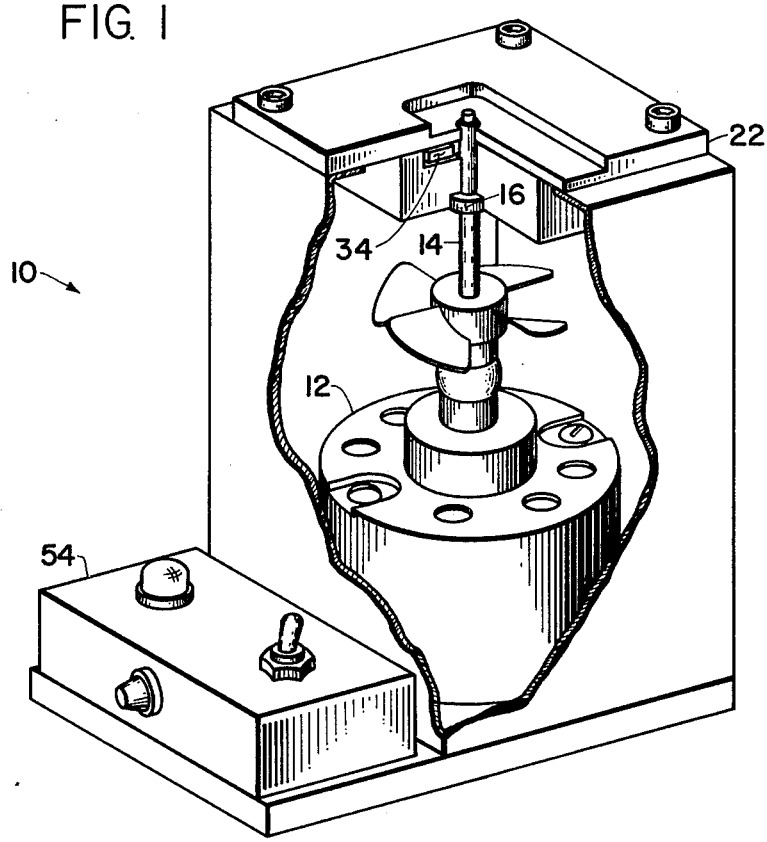
FIG. 1 presents a reduced side perspective view of the test apparatus of the embodiment of the invention with a section broken out for enhancing the clarity thereof.

Referring to FIG. 1, the embodiment of the invention is shown as comprising; housing member 10 in which is mounted electric motor 12, of the synchronous pole type, nonmagnetic shaft member 14 attached at its lower end to motor 12 with its upper end being supported within journal type bearing 16.

As illustrated in FIG. 2, nonmagnetic shaft 14 is fabricated to include a reduced portion 18, sized to fit journal bearing 16. Nonmagnetic shaft 14 includes a further reduced portion 20 which is sized to fit through housing member 10 and to extend outwardly of housing plate 22 of housing member 10. Journal bearing 16 is contained in nonmagnetic housing 24 which is attached to the bottom surface 26 of top plate 22. Cavities 28 and 30 are provided in housing 24 to receive electromagnet 32 such that pole pieces 34 and 36 of electromagnet 32 are positioned with respect to shaft portion 20 and the particular workpiece to be tested.

By way of example, electromagnet 32 may consist of a stack of 15 U-shaped transformer laminations 38 made from 0.004 inch thickness silicon iron or equivalent material, with coil member 40 positioned about one of the pole pieces 34 or 36 of electromagnet 32. Bobbin 42 is formed from any suitable plastic material and is wound with approximately 7500 turns of number 42 gauge (AWG 0.0025 diameter) copper magnet wire with the finished coil having an electrical resistance of approximately 1,000 ohms. It is understood, that if current were supplied to coil member 40, the core of electromagnetic 32 comprising transformer 38 would become magnetized such that pole pieces 34 and 38 are polarized and act as a magnet. It is further understood that if a permanent magnet were placed between pole pieces 34 and 36 and rotated, alternating magnetic flux lines are established in the core at a frequency proportional to the rotational velocity of the magnet. The alternating flux lines through coil 40 produce an alternating current therein. Thus, electro magnet 32 may be used as a pickup transducer for producing an electric current in response to a magnet being rotated within the opening of pole pieces 34 and 36.

As illustrated in FIGS. 2-6, upper end portion 20 of shaft 14 is fabricated with a cavity in order to accept insert 44 or 46. Insert 44 is made with an extending boss member 48. Insert 46 is constructed to include cavity 49. In this manner, either a magnetic disk member 50 or, in the preferred embodiment, rotor axle assembly 52 can be tested. If only disk magnet 50 is to be tested, it is fitted over boss member 48 of insert 44. However, if the complete rotor/axle assembly 52 is to be tested, insert 46 is fitted into shaft portion 20 and the rotor/axle assembly inserted therein.

Housing test unit 10 together with associated electrical circuit components contained in compartment 54 are packaged so that the unit can be installed with the working surface 22, in the preferred embodiment, either flush or slightly higher than the bench top of a testing station.

In operation, the magnetic workpiece to be tested is placed over boss member 48 or into insert 46, respectively and electric motor 12 activated. The magnetic workpiece is effectively attached for rotational purposes by the magnetic attraction between either of the magnet members 50 or 52 and the pole pieces 34 and 36 of electro magnet 32.

Figure 7:
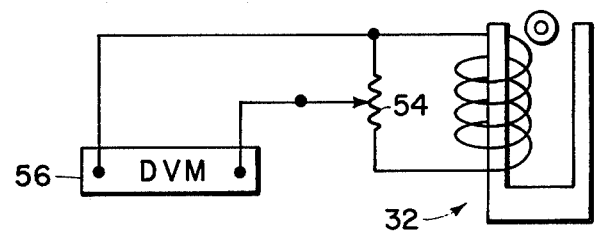
FIG. 7 is a wiring schematic of the magnetic detecting mechanism.

Shaft 14, with the attached magnetic workpiece, is rotated at a speed of approximately 3,000 RPM which produces an alternating magnetic field in the pole pieces of the electromagnet which in turn produces an alternating current voltage in the coil member as previously discussed. As illustrated in FIG. 7, the generated alternating current voltage is applied across a potentiometer 54, and measured directly by, for example, a digital volt meter 56. By having maximum and minimum reference points marked on digital volt meter 56, a test operator can visually and quickly inspect the work piece to determine if the magnetic strength is within an acceptable range.

Thus, what has been described above is a test apparatus for quickly and inexpensively testing the magnetic disk or rotor/axle assembly for miniature motors. Therefore, minimum production costs are required for the testing thereof.

While the above detailed description as shown described and pointed out the fundamental and novel features of the invention, it will be understood that various omissions, substitutions and changes in the form and detail of the circuits may be made by those skilled in the art without departing from the spirit of the invention. It is the intention, therefore, to be limited only as indicated by the scope of the following claims.

What is claimed is:

1. Apparatus for measuring the relative magnetic field strength of a miniature permanent magnet assembly, comprising in combination:
   a nonmagnetic shaft having a reduced end portion in which is formed a cavity;
   insert means adapted to receive the magnet assembly during test, said insert means being positioned within said cavity of said reduced portion of said shaft;
   means attached to the other end of said shaft for rotating said shaft whereby the magnetic assembly is rotated;
   transducer means fixedly located about said rotating non-magnetic shaft including a coil and core members, said core member being u-shaped and having a portion thereof disposed through said coil;
   said insert means being positioned within the opening of said u-shaped core members so that during testing the magnetic assembly is rotated within said opening such that the magnetic field of the magnet member produces an alternating current in said coil member which alternating current is proportional to the magnetic field strength of the magnet member said insert means spatially fixing the magnet assembly with respect to said opening of said u-shaped core member to establish a magnetic circuit comprising the magnet assembly and said u-shaped core member having only two air gaps therein whereby the efficiency of said magnetic circuit is increased; and
   means coupled to said coil member and being responsive to said alternating current for visually displaying a parameter indicative of the relative magnetic field strength of the magnetic workpiece being tested.

2. The apparatus of claim 1, further comprising:
   a housing member for mounting of said rotating means and said transducer means so that said transducer means is accurately positioned about said shaft; and
   said housing member including a bearing member through which said shaft is rotatably mounted.

3. An apparatus for measuring the relative magnetic field strength of magnetic workpieces which include a permanent magnet member, comprising in combination:
   a test housing;
   an electric motor of a synchronous pole type mounted within said test housing;
   a nonmagnetic shaft, said shaft being attached at one end thereof to said motor so that said shaft is rotated by said motor when said motor is rendered operative, the other end of said shaft having a reduced portion in which a cavity is formed;
   a journal bearing member disposed in said test housing through which the other end of said shaft is rotatably inserted and extends therethrough;
   insert means adapted to receive the magnetic workpiece to be tested for affixing the magnetic workpiece onto said other end of said shaft, said insert means being positioned within said cavity of said reduced portion;
   transducer means disposed in said test housing including a u-shaped core member and a coil member disposed about one pole of said core member, said core member being positioned about said other end of said shaft so that the magnet member of the magnetic workpiece to be tested is disposed within the opening of said u-shaped core member, said u-shaped core member and the magnet member forming a magnetic circuit having only two air gaps whereby the efficiency of the apparatus is increased;
   said transducer means being responsive to the magnet member being rotated during test by said motor such that an alternating current is produced in said coil member which is proportional to the magnetic field strength of the magnet member; and
   means coupled to said coil member for displaying a parameter indicative of the magnetic field strength of the magnet member under test in response to the magnitude of said alternating current being produced in said transducer means.

4. The apparatus of claim 2 wherein said insert means includes an extending boss member onto which the magnetic assembly is adapted to be placed for testing thereof.

5. The apparatus of claim 2 wherein said insert means includes a cavity formed therein into which the magnetic assembly is adapted to be inserted for testing thereof.

6. The apparatus of claim 3 wherein said insert means includes an end portion and an extending boss member, said end portion being fitted into said cavity of said shaft.

7. The apparatus in accordance with claim 3 wherein said insert means includes a shaft member having a cavity formed therein to receive the magnetic workpieces during testing thereof.

* * * * *